US011380572B2

(12) United States Patent
Prouty et al.

(10) Patent No.: US 11,380,572 B2
(45) Date of Patent: Jul. 5, 2022

(54) SUBSTRATE SUPPORT CARRIER WITH IMPROVED BOND LAYER PROTECTION (71) Applicant: Applied Materials, Inc., Santa Clara, CA (US)

(72) Inventors: Stephen Donald Prouty, San Jose, CA (US); Andreas Schmid, Meyriez (CH); Jonathan Simmons, San Jose, CA (US); Sumanth Banda, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 163 days.

(21) Appl. No.: 16/857,082

(22) Filed: Apr. 23, 2020

(65) Prior Publication Data

US 2020/0373184 A1 Nov. 26, 2020

Related U.S. Application Data (60) Provisional application No. 62/852,843, filed on May 24, 2019.

(51) Int. Cl.
*H01T 23/00* (2006.01)
*H01L 21/683* (2006.01)
*H01L 21/673* (2006.01)

(52) U.S. Cl.
CPC .... *H01L 21/6833* (2013.01); *H01L 21/67376* (2013.01)

(58) Field of Classification Search
None
See application file for complete search history.

(56) References Cited

U.S. PATENT DOCUMENTS 6,490,144 B1  12/2002  Narendrnath et al.
8,449,786 B2  5/2013   Larson et al.
(Continued)

FOREIGN PATENT DOCUMENTS

JP    2013131541 A    7/2013
JP    2015195346 A    11/2015
(Continued)

OTHER PUBLICATIONS

International Search Report and Written Opinion for Application No. PCT/US2019/018589 dated May 31, 2019.
(Continued)

*Primary Examiner* — Stephen W Jackson
(74) *Attorney, Agent, or Firm* — Patterson + Sheridan, LLP (57) ABSTRACT A substrate support pedestal comprises an electrostatic chuck, a cooling base, a gas flow passage, a porous plug, and a sealing member. The electrostatic chuck comprises body having a cavity. The cooling base is coupled to the electrostatic chuck via a bond layer. The gas flow passage is formed between a top surface of the electrostatic chuck and a bottom surface of the cooling base. The gas flow passage further comprises the cavity. The porous plug is positioned within the cavity to control the flow of gas through the gas flow passage. The sealing member is positioned adjacent to the porous plug and is configured to form one or more of a radial seal between the porous plug and the cavity and an axial seal between the porous plug and the cooling base.

20 Claims, 9 Drawing Sheets (56) References Cited

U.S. PATENT DOCUMENTS

| | | | |
|---|---|---|---|
| 9,627,240 B2 * | 4/2017 | Yamaguchi | H01L 21/68757 |
| 9,685,356 B2 | 6/2017 | Parkhe et al. | |
| 9,960,067 B2 | 5/2018 | Anada et al. | |
| 10,688,750 B2 | 6/2020 | Parkhe et al. | |
| 2009/0229753 A1 | 9/2009 | Ohmi et al. | |
| 2010/0156054 A1 | 6/2010 | Sun et al. | |
| 2011/0272899 A1 | 11/2011 | Shimazu | |
| 2013/0088808 A1 | 4/2013 | Parkhe | |
| 2014/0376148 A1 | 12/2014 | Sasaki et al. | |
| 2015/0332942 A1 | 11/2015 | Peh et al. | |
| 2016/0276196 A1 | 9/2016 | Parkhe | |
| 2016/0352260 A1 | 12/2016 | Comendant | |
| 2017/0243726 A1 | 8/2017 | Kellogg | |
| 2017/0256431 A1 | 9/2017 | Parkhe | |
| 2018/0025933 A1 | 1/2018 | Ishimura et al. | |
| 2018/0090361 A1 | 3/2018 | Sasaki et al. | |
| 2019/0099977 A1 | 4/2019 | Parkhe et al. | |
| 2019/0267277 A1 | 8/2019 | Sasaki et al. | |
| 2020/0105568 A1 | 4/2020 | Pilgrim | |

FOREIGN PATENT DOCUMENTS

| | | |
|---|---|---|
| JP | 6110159 B2 | 4/2017 |
| JP | 2018101773 A | 6/2018 |

OTHER PUBLICATIONS

International Search Report and Written Opinion for Application No. PCT/US2020/029211 dated Aug. 12, 2020.

* cited by examiner

FIG. 9

SUBSTRATE SUPPORT CARRIER WITH IMPROVED BOND LAYER PROTECTION

CROSS-REFERENCE TO RELATED APPLICATIONS

This application claims priority to U.S. Provisional Patent Application 62/852,843, filed on May 24, 2019, the disclosure of which is incorporated herein by reference in its entirety.

BACKGROUND

Field

The embodiments of the disclosure generally relate to a substrate support pedestal having a protected bond layer for use in a substrate process chamber.

Description of the Related Art

Substrate support pedestals are widely used to support substrates within semiconductor processing systems during substrate processing. The substrate support pedestals generally include an electrostatic chuck bonded to a cooling base with a bond layer. An electrostatic chuck generally includes one or more embedded electrodes which are driven to an electrical potential to hold a substrate against the electrostatic chuck during processing. The cooling base typically includes one or more cooling channels and aids in controlling the temperature of the substrate during processing. Further, the electrostatic chuck may include one or more gas flow passages that allow a gas to flow between the electrostatic chuck and the substrate to assist in controlling the temperature of the substrate during process. The gas fills the area between the electrostatic chuck and the substrate, enhancing the heat transfer rate between the substrate and the substrate support. However, when a substrate is not present, the gas flow passages also provide a path for the process gases to flow into the area between the electrostatic chuck and the cooling base where the bond layer is located. Consequently, the bond layer is eroded by the process gases.

The erosion of bond layer is problematic for at least two reasons. First, material eroded from bond layer is a process contaminant that produces defects and reduces product yields. Secondly, as the bond layer is eroded, the local rate heat transfer between the electrostatic chuck and cooling base changes, thereby creating undesirable temperature non-uniformities on the substrate and process drift.

Therefore, there is a need for an improved substrate support pedestal.

SUMMARY OF THE DISCLOSURE

In one example, an electrostatic chuck has a body comprising a top surface, a cavity, a gas flow passage, and a porous plug. The gas flow passage is formed between the top surface and the cavity. The porous plug is positioned within the cavity. A sealing member is positioned adjacent to the porous plug and is configured to form one or more of a radial seal between the porous plug and the cavity and an axial seal between the porous plug and a cooling base bonded to the electrostatic chuck.

In one example, a substrate support pedestal is provided that includes an electrostatic chuck, a cooling base, a gas flow passage, a porous plug, and a sealing member. The electrostatic chuck having a body comprising a cavity. The cooling base is coupled to the electrostatic chuck via a bond layer. The gas flow passage is formed between a top surface of the electrostatic chuck and a bottom surface of the cooling base. The gas flow passage further includes the cavity. The porous plug is positioned within the cavity. The sealing member is positioned adjacent to the porous plug and is configured to form one or more of a radial seal between the porous plug and the cavity and an axial seal between the porous plug and the cooling base.

In one example, a process chamber comprises a chamber body, an electrostatic chuck, a cooling base, a gas flow passage, a porous plug and a sealing member. The chamber body has a processing volume. The electrostatic chuck is disposed in the processing volume and has a top surface configured to support a substrate during processing. The electrostatic chuck further comprises a bottom surface and a cavity. The cooling base is coupled to the electrostatic chuck via a bond layer. The gas flow passage is formed between the top surface of the electrostatic chuck and a bottom surface of the cooling base. Further, the gas flow passage passes through the cavity. The porous plug is positioned within the cavity. The sealing member is positioned adjacent to the porous plug and is configured to form one or more of a radial seal between the porous plug and the cavity and an axial seal between the porous plug and the cooling base.

BRIEF DESCRIPTION OF DRAWINGS

So that the manner in which the above recited features of the present disclosure are attained and can be understood in detail, a more particular description of the disclosure, briefly summarized above, may be had by reference to the embodiments thereof which are illustrated in the appended drawings. It is to be noted, however, that the appended drawings illustrate only embodiments of this disclosure and are therefore not to be considered limiting of its scope, for the disclosure may admit to other equally effective embodiments.

To facilitate understanding, identical reference numerals have been used, wherever possible, to designate identical elements that are common to the figures.

DETAILED DESCRIPTION

The systems and methods discussed herein employ substrate support pedestals that have a cooling base and electrostatic chuck bonded together via a bond layer. A porous plug is positioned in a gas flow passage formed in the cooling base and the electrostatic chuck. The restriction of the porous plug protects the bond layer from the process gases utilized during substrate processing. Advantageously, the following embodiments discuss improved techniques for securing the porous plug within the gas flow passage to prevent degradation of the bond layer through the utilization of a radial seal that substantially prevents gas flowing around the porous plug.

Figure 1:
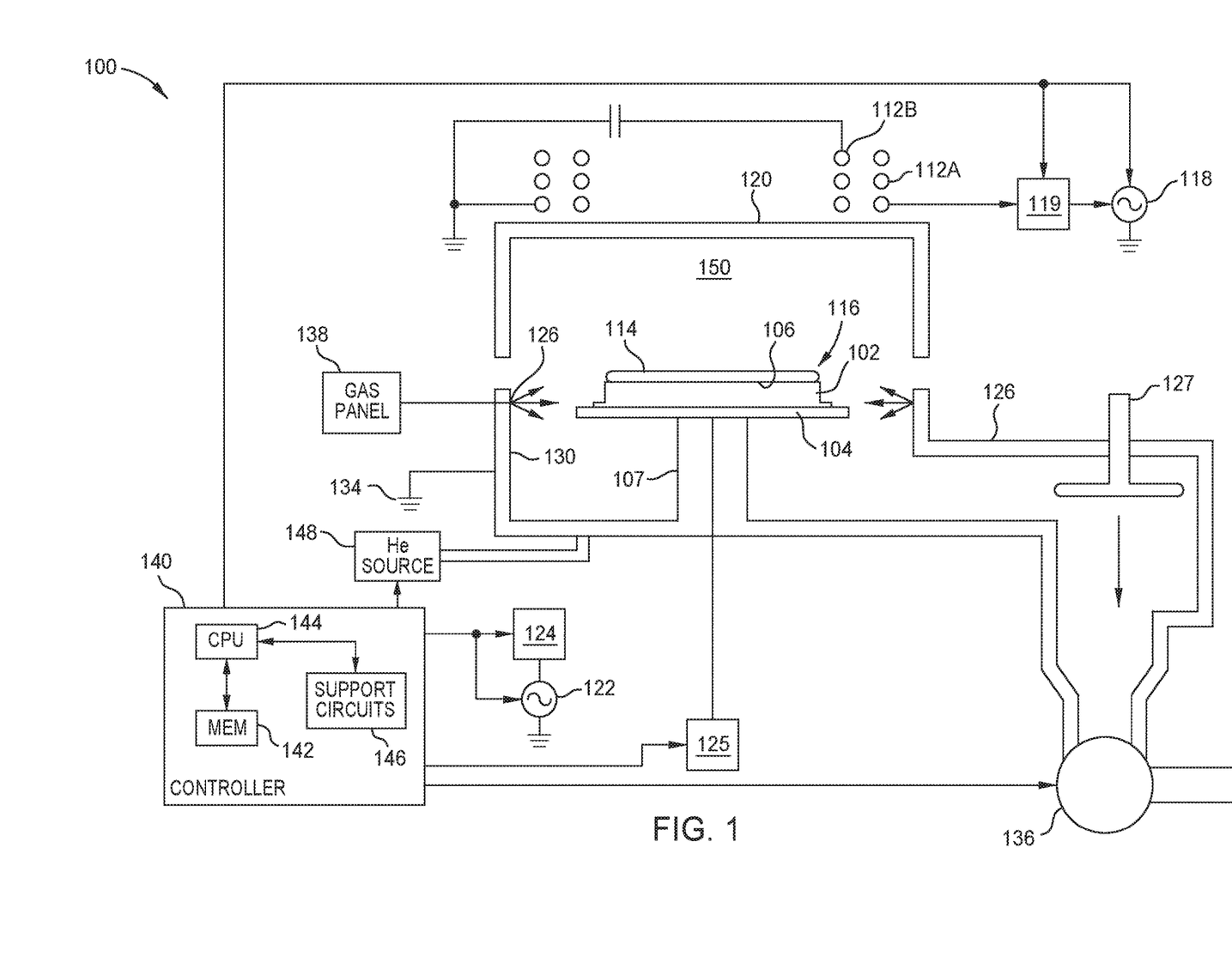
FIG. 1 depicts a schematic of a process chamber having a substrate support pedestal, according to one or more embodiments.

FIG. 1 depicts a schematic diagram of a process chamber 100, according to one or more embodiments. The process chamber 100 includes at least an inductive coil antenna segment 112A and a conductive coil antenna segment 112B, both positioned exterior to a dielectric, ceiling 120. The inductive coil antenna segment 112A and the conductive coil antenna segment 112B are each coupled to a radio-frequency (RF) source 118 that produces an RF signal. The RF source 118 is coupled to the inductive coil antenna segment 112A and to the conductive coil antenna segment 1126 through a matching network 119. Process chamber 100 also includes a substrate support pedestal 116 that is coupled to an RF source 122 that produces an RF signal. The RF source 122 is coupled to the substrate support pedestal 116 through a matching network 124. The process chamber 100 also includes a chamber wall 130 that is conductive and connected to an electrical ground 134.

A controller 140 comprising a central processing unit (CPU) 144, a memory 142, and support circuits 146. The controller 140 is coupled to the various components of the process chamber 100 to facilitate control of the substrate processing process.

In operation, the semiconductor substrate 114 is placed on the substrate support pedestal 116 and gaseous components are supplied from a gas panel 138 to the process chamber 100 through entry ports 126 to form a gaseous mixture in a processing volume 150 of the process chamber 100. The gaseous mixture in the processing volume 150 is ignited into a plasma in the process chamber 100 by applying RF power from the RF sources 118, 122 respectively to the inductive coil antenna segment 112A, the conductive coil antenna segment 112B and to the substrate support pedestal 116. Additionally, chemically reactive ions are released from the plasma and strike the substrate; thereby removing exposed material from the substrate's surface.

The pressure within the interior of the process chamber 100 is controlled using a throttle valve 127 situated between the process chamber 100 and a vacuum pump 136. The temperature at the surface of the chamber walls 130 is controlled using liquid-containing conduits (not shown) that are located in the chamber walls 130 of the process chamber 100.

The substrate support pedestal 116 comprises an electrostatic chuck 102 disposed on a cooling base 104. The substrate support pedestal 116 is generally supported above the bottom of the process chamber 100 by a shaft 107 coupled to the cooling base 104. The substrate support pedestal 116 is fastened to the shaft 107 such that the substrate support pedestal 116 can be removed from the shaft 107, refurbished, and re-fastened to the shaft 107. The shaft 107 is sealed to the cooling base 104 to isolate various conduits and electrical leads disposed therein from the process environment within the process chamber 100. Alternatively, the electrostatic chuck 102 and cooling base 104 maybe disposed on an insulating plate that is attached to a ground plate or chassis. Further, the ground plate may be attached to one or more of the chamber walls 130.

The temperature of the semiconductor substrate 114 is controlled by stabilizing the temperature of the electrostatic chuck 102. For example, a backside gas (e.g., helium or other gas) may be provided by a gas source 148 to a plenum defined between the semiconductor substrate 114 and a support surface 106 of the electrostatic chuck 102. The backside gas is used to facilitate heat transfer between the semiconductor substrate 114 and the substrate support pedestal 116 to control the temperature of the substrate 114 during processing. The electrostatic chuck 102 may include one or more heaters. For example, the heaters may be electrical heaters or the like.

Figure 2:
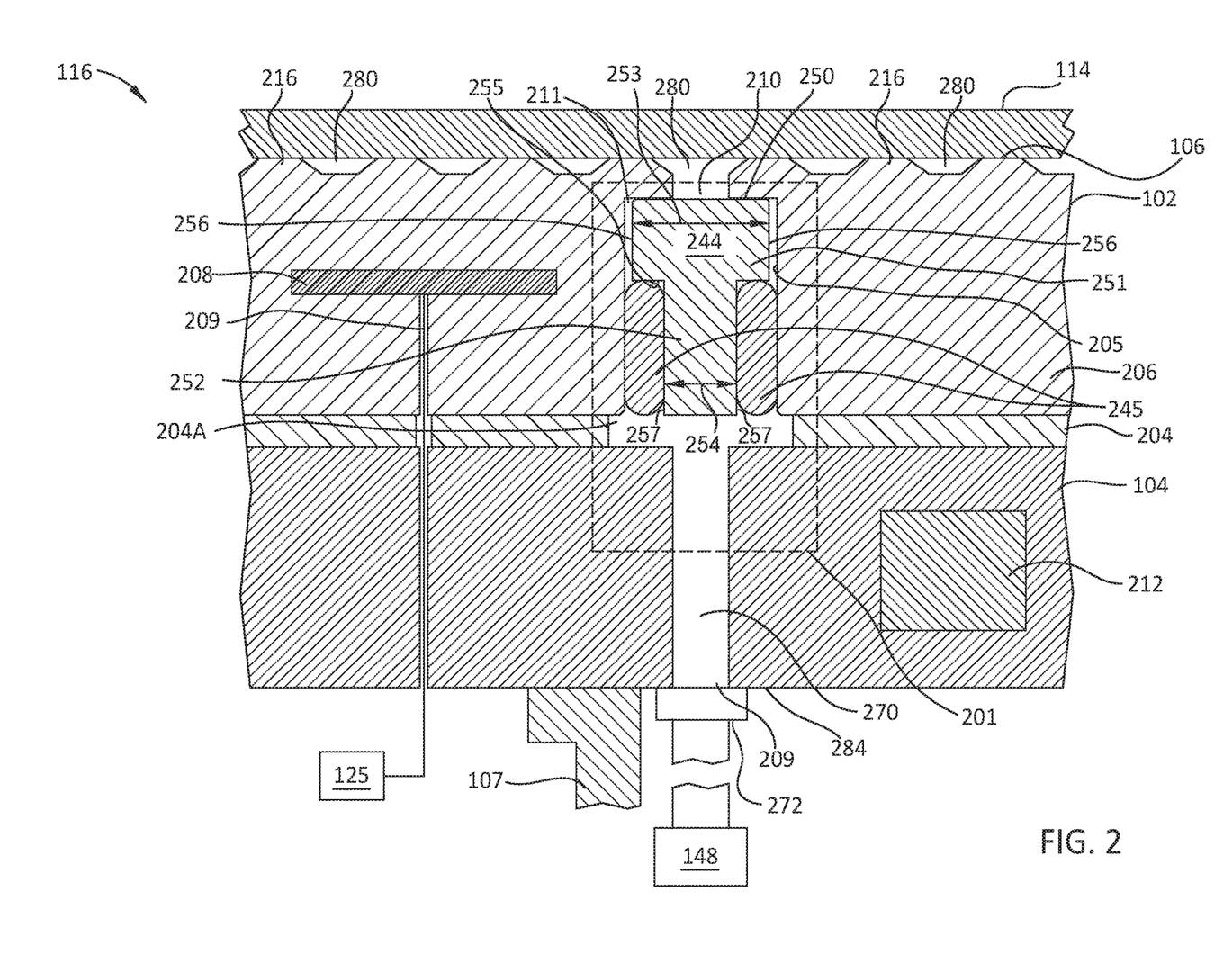
FIG. 2 depicts a partial sectional view of the substrate support pedestal, according to one or more embodiments.

FIG. 2 depicts a vertical cross-sectional view of a portion of the substrate support pedestal 116 depicted in FIG. 1, according to one or more embodiments. As is discussed above the substrate support pedestal 116 has the cooling base 104 secured to the electrostatic chuck 102. In the example depicted in FIG. 2, the cooling base 104 is secured to the electrostatic chuck 102 by a bond layer 204.

The bond layer 204 comprises one or more materials such as an acrylic or silicon-based adhesive, epoxy, neoprene based adhesive, an optically clear adhesive such as a clear acrylic adhesive, or other suitable adhesive materials.

The cooling base 104 is generally fabricated from a metallic material such as stainless steel, aluminum, aluminum alloys, among other suitable materials. Further, the cooling base 104 includes one or more cooling channels 212 disposed therein that circulate a heat transfer fluid to maintain thermal control of the substrate support pedestal 116 and the substrate 114.

The electrostatic chuck 102 is generally circular in form but may alternatively comprise other geometries to accommodate non-circular substrates. For example, the electrostatic chuck 102 may comprise a square or rectangular substrate when used in processing display glass, such as such as glass for flat panels displays. The electrostatic chuck 102 generally includes a body 206 including one or more electrodes 208. The electrodes 208 are comprised of an electrically conductive material such as copper, graphite, tungsten, molybdenum and the like. Various embodiments of electrode structures include, but are not limited to, a pair of coplanar D-shaped electrodes, coplanar interdigital electrodes, a plurality of coaxial annular electrodes, a singular, circular electrode or other structure. The electrodes 208 are coupled to a power supply 125 by a feed through 209 disposed in the substrate support pedestal 116. The power supply 125 may drive the electrode 208 with a positive or negative voltage. For example, the power supply 125 may drive the electrode 208 with a voltage of about −1000 volts or a voltage of about 2500 volts. Alternatively, other negative voltages or other positive voltages may be utilized.

The body 206 of the electrostatic chuck 102 may be fabricated from a ceramic material. For example, the body 206 of the electrostatic chuck 102 may be fabricated from a low resistivity ceramic material (i.e., a material having a resistivity between about $1 \times E^9$ to about $1 \times E^{11}$ ohm-cm). Examples of low resistivity materials include doped ceramics such as alumina doped with titanium oxide or chromium oxide, doped aluminum oxide, doped boron-nitride and the like. Other materials of comparable resistivity, for example, aluminum nitride, may also be used. Such ceramic materials having relatively low resistivity generally promote a Johnsen-Rahbek attractive force between the substrate and electrostatic chuck 102 when power is applied to the electrodes 208. Alternatively, a body 206 comprising ceramic materials having a resistivity equal to or greater than $1Ex^{11}$ ohms-cm may also be used. Further, the body 206 of the electrostatic chuck 102 may be fabricated from an aluminum oxide.

The support surface 106 of the body 206 includes a plurality of mesas 216 disposed inwards of a seal ring (not shown) formed on the support surface 106. The seal ring is comprised of the same material comprising the body 206 but may alternatively be comprised of other dielectric materials. The mesas 216 are generally formed from one or more layers of an electrically insulating material having a dielectric constant in the range of about 5 to about 10. Examples of such insulating materials include, but are not limited to, silicon nitride, silicon dioxide, aluminum oxide, tantalum pentoxide, polyimide and the like. Alternatively, the mesas 216 may be formed from the same material as the body 206 and then coated with a high resistivity dielectric film.

During operation, an electrical field generated by driving the electrodes 208 holds the substrate 114 on the support surface 106 with a clamping force. The clamping force is greatest at each mesa 216. Further, the mesas 216 may be positioned and/or sized to achieve a uniform charge distribution across the backside of the substrate.

A backside gas (e.g., helium, nitrogen or argon) is introduced to a plenum 280 by the gas source 148 to aid in the control the temperature across the substrate 114 when it is retained by the electrostatic chuck 102. The plenum 280 is defined between the support surface 106 of the electrostatic chuck 102 and the substrate 114. Further, the backside gas within the plenum 280 provides a heat transfer medium between the electrostatic chuck 102 and the substrate 114. The backside gas is generally provided to the plenum 280 through one or more gas flow passages 270 formed through the body 206 and the cooling base 104. Further, each gas flow passage 270 terminates at a corresponding opening 210 formed through the support surface 106 of the body 206.

The gas flow passage 270 extends from the support surface 106 of the body 206 to a bottom surface 284 of the cooling base 104. The gas flow passage 270 includes the opening 210 in the electrostatic chuck 102, an opening 209 in the cooling base 104, and a cavity 211 formed in the body 206 of the electrostatic chuck 102. The cavity 211 may have a sectional area, such as a diameter, that is greater than a sectional area of at least one of the opening 210 and the opening 209. The opening 209 may have a diameter that is greater than, less than or equal to the diameter of the opening 210. Further, while a single gas flow passage 270 is illustrated in FIG. 2, the substrate support pedestal 116 may include multiple gas flow passages.

The gas flow passage 270 is coupled to the gas source 148. Additionally, each of gas flow passage 270 may be coupled to the gas source 148 through a single port 272. Alternatively, each gas flow passage 270 may be individually coupled to the gas source 148 through separate ports 272.

A porous plug 244 is generally disposed within the gas flow passage 270 (within the cavity 211) such that it forms a part of the gas flow passage 270. The porous plug 244 provides a path for pressurized gas to flow between two surfaces of different electrical potential. For example, the porous plug 244 provides a path for pressurized gas to flow between a first and second surface of the electrostatic chuck 102, and between a first surface of the electrostatic chuck 102 and a first surface of the cooling base 104. Further, the porous plug 244 comprises a plurality of small passage ways which reduce the probability that plasma will ignite in the gap 204A between the electrostatic chuck 102 and the cooling base 104 as compared to a design not including the porous plug 244. The porous plug 244 is generally comprised of a ceramic material such as aluminum oxide or aluminum nitride. Alternatively, the porous plug 244 may be comprised of other porous materials. Further, the porous plug 244 may have a porosity of about 30 to about 80 percent. Alternatively, the porous plug may have a porosity of less than 30 percent or greater than 80 percent. Additionally, the porous plug 244 abuts a step 250 that defines the top of the cavity 211.

The porous plug 244 has a t-shape. A t-shaped porous plug provides increased gas flow as compared to porous plugs of other shapes and is easier to install into the cavity 211 than porous plugs of other shapes. The porous plug 244 may include a head 251 and a shaft 252. The head 251 has a diameter 253 and the shaft 252 has a diameter 254. Further, the diameter 253 is larger than the diameter 254. Additionally, the head includes bottom surface 255 which meets the shaft 252. The head 251 further includes surface 256 facing the sidewall 205 of the cavity 211. Further, the shaft 252 includes a surface 257 facing the sidewall 205 of the cavity 211. In various embodiments, the porous plug 244 may be positioned within the cavity 211 using various techniques such as press fitting, slip fitting, clearance fitting, pinning, and bonding, among others. For example, the porous plug 244 may be positioned within the cavity such that the surface 256 of the head 251 is in contact with the sidewall 205 or such that there is a gap between the surface 256 of the head 251 and the sidewall 205.

The sealing member 245 is disposed adjacent to the porous plug 244. The sealing member 245 forms a seal between the surface 257 of the porous plug 244 and the sidewall 205 of the cavity 211. The sealing member 245 may form at least one of a radial seal between the porous plug 244 and the cavity 211 and an axial seal between the porous plug 244 and the cooling base 104. Further, the sealing member 245 may secure the porous plug 244 within the cavity 211. For example, the sealing member 245 may be coupled to at least one of the porous plug 244 and the sidewall 205 of the cavity 211 using various techniques, such as press fitting, pinning, and bonding, among others. The sealing member 245 may mechanically secure the porous plug 244 to the sidewall 205 of the cavity 211.

The sealing member 245 may be comprised of a resilient polymeric material, such as an elastomer. Further, the sealing member 245 may be comprised of one or more of a fluoroelastomer material (e.g., a FKM), a perfluoroelastomer material (e.g., a FFKM), and a highly purity ceramic. The highly purity ceramic may be greater than 99% pure and may be a ceramic paste or a solid suspended in solution. Further, the sealing member 245 may be comprised of a material that is erosion resistive to the process gases. For example, erosion resistive materials do not erode in the presence of process gases. Additionally, or alternatively, the material of the sealing member 245 is selected such that the material does not penetrate the porous plug 244. The sealing member 245 may be an O-ring, a cylindrical gasket, or other ring-shaped seal. Alternatively, the sealing member 245 may be formed from a material that is applied in one of a liquid, paste and/or gel and changes state to a substantially solid or gel form. Further, the sealing member 245 may be comprised of a substantially non-adhesive material.

The bond layer 204 secures the body 206 to the cooling base 104. Further, a gap 204A is formed in the bond layer 204 and is part of the gas flow passage 270. As the material or materials that typically make up the bond layer 204 are susceptible to erosion in the presence of the process gases used during substrate processing, various methods for protecting the bond layer 204 from the process gases have been explored. Advantageously, by employing a sealing member, e.g., the sealing member 245, which is highly erosion resistive to the process gases, the process gas passing through the porous plug 244 may be prevented. Thus, the life of the bond layer 204 is increased. Additionally, the useful service life of the substrate support pedestal 116 is increased.

Figure 3:
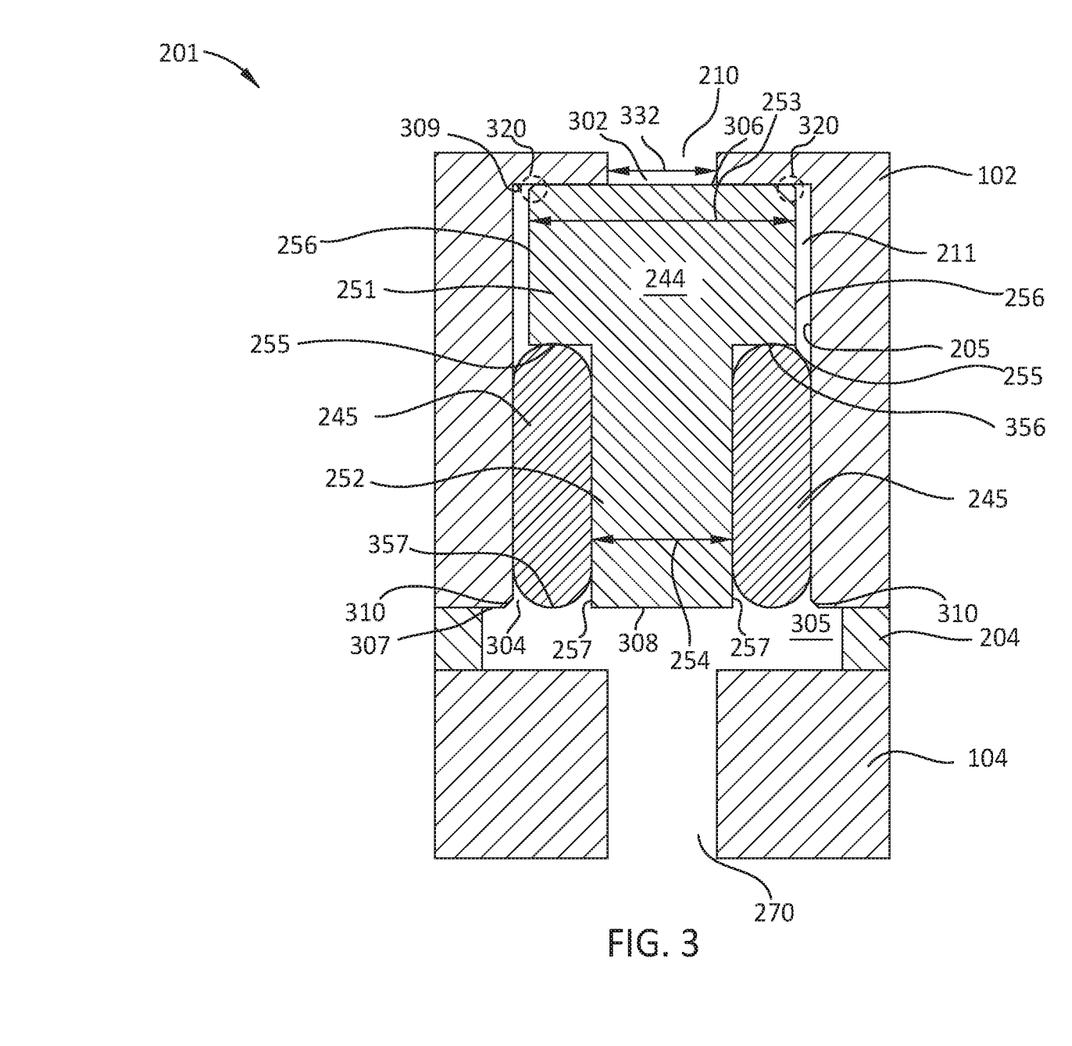
FIGS. 3, 4, 5, 6, 7, 8 and 9 are partial sectional views of the substrate support pedestal, according to one or more embodiments.

FIG. 3 is a schematic cross-section of a portion 201 of the substrate support pedestal 116, according to one or more embodiments. As is described above, the porous plug 244 has the head 251 and the shaft 252, forming the t-shape of the porous plug 244. A t-shaped porous plug may provide a better gas flow than porous plugs of other shapes and may be easier to install into the cavity 211 than porous plugs of other shapes. Further, the porous plug 244 prevents the backside gas from flowing into the gap between the electrostatic chuck 102 and the cooling base 104 and negatively affecting (e.g., eroding) the bond layer 204.

The porous plug 244 may extend from a first end 302 of the cavity 211 to a second end 304 of the cavity 211. For example, the surface 306 of the porous plug 244 may contact the surface 309 of the cavity, and the surface 308 of the porous plug 244 and the surface 307 of the electrostatic chuck 102 may be coplanar, such that the surface 308 does extend into the gap 305 between the electrostatic chuck 102 and the cooling base 104. Alternatively, the surface 308 may extend into the gap 305 between the electrostatic chuck 102 and the cooling base 104. Further, the surface 308 may be between the surface 309 and the surface 307.

As is stated above with regard to FIG. 2, the porous plug 244 includes the diameter 253 that is greater than the diameter 332 of the opening 210. Further, the porous plug 244 and the opening 210 are concentric. Additionally, or alternatively, the porous plug 244 and the opening 209 are concentric.

The cavity 211 includes a chamfered edge 310 formed where the sidewall 205 meet the bottom surface 307 of the electrostatic chuck 102. Further, the porous plug 244 may have a chamfered edge where the surface 306 meets the surface 256. The chamfered edge 310 of the cavity 211 and the chamfered edge 320 of the porous plug 244 aid in the insertion of the porous plug 244 into the cavity 211. Further, the chamfered edge 310 reduces possible damage that may be caused to the sealing member 245 when the sealing member 245 is inserted into the cavity around the porous plug 244, or the sealing member 245 expands during substrate processing.

The sealing member 245 is adjacent to the porous plug 244. The sealing member 245 forms a radial seal between the porous plug 244 and the cavity 211. For example, the sealing member 245 may contact the surface 257 of the porous plug 244 and the sidewall 205 of the cavity 211, preventing process gases from flowing along the sides of the porous plug 244. Further, the sealing member 245 may secure the porous plug 244 within the cavity 211. For example, the sealing member 245 may exert a force on the sidewall 205 of the cavity 211 and the surface 257 of the porous plug 244 such that the porous plug 244 is held within the cavity 211. Additionally, the sealing member 245 includes surfaces 356 and 357. One or more of the surfaces 356 and 357 may have a substantially curved shape. The substantially curved shape may be convex or concave. Further, one or more of the surfaces 356 and 357 may have a substantially flat shape.

The sealing member 245 may completely reside within the cavity 211 or the sealing member 245 may at least partially extend into the gap 305 between electrostatic chuck 102 and the cooling base 104. Further, the sealing member 245 may be sized such that the sealing member 245 does not exceed the opening of the cavity 211 defined between the surface 255 of the porous plug 244, the surface 257 of the shaft 252, the surface 307 of the electrostatic chuck 102, and the sidewall 205 of the cavity 211. Additionally, or alternatively, the bonding layer 204 may extend into the gap 305 such that the bonding layer 204 at least partially contacts the sealing member 245.

Figure 4:
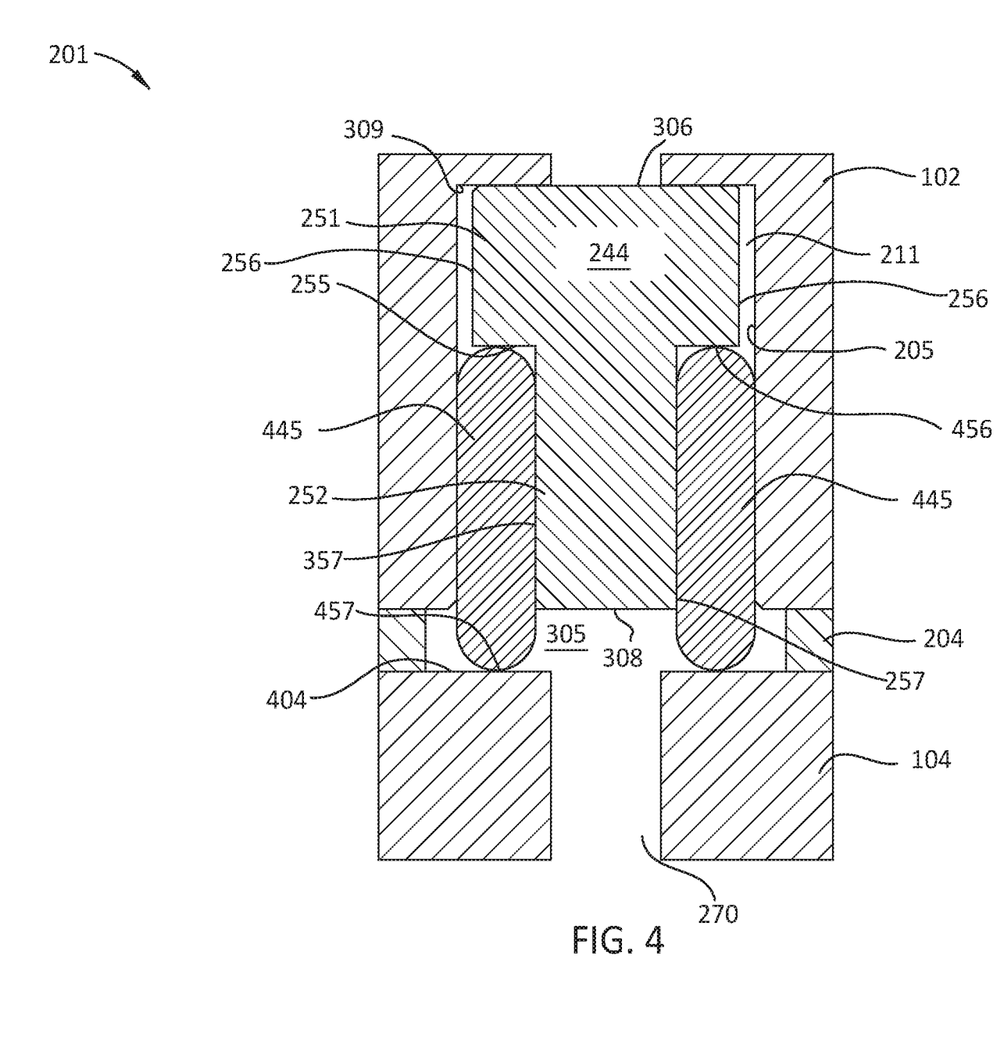

FIG. 4 is a schematic cross-section of the portion 201 of the substrate support pedestal 116, having a different sealing member 445. As compared to the sealing member 245 of FIG. 3, the sealing member 445 of FIG. 4 forms a radial seal between the surface 257 of the shaft 252 the sidewall 205 of the cavity 211 and an axial seal between the surface 255 of the porous plug 244 and a surface 404 of the cooling base 104. For example, the sealing member 245 may contact the surface 257 and the surface 255 of the porous plug 244, the sidewall 205 of the cavity 211 and the surface 404 of the cooling base 104. The sealing member 445 is positioned adjacent to the porous plug 244. For example, the sealing member 445 is positioned between the porous plug 244 and the sidewall of the cavity 211. Further, the sealing member is positioned between the porous plug 244 and the cooling base 104. Additionally, the sealing member 445 may be formed similar to that of the sealing member 245. For example, the sealing member 445 may be an O-ring, a cylindrical gasket, or other ring-shaped seal. Further, the sealing member 245 may be formed from a material that is erosion resistive in the presence of the process gases used during substrate processing as are described above with regard to the sealing member 245. Additionally, the sealing member 445 includes surfaces 456 and 457. One or more of the surfaces 456 and 457 may have a substantially curved shape. The substantially curved shape may be convex or concave. Further, one or more of the surfaces 456 and 457 may have a substantially flat shape. Further, the bonding layer 204 may at least partially contact the sealing member 445.

Figure 5:
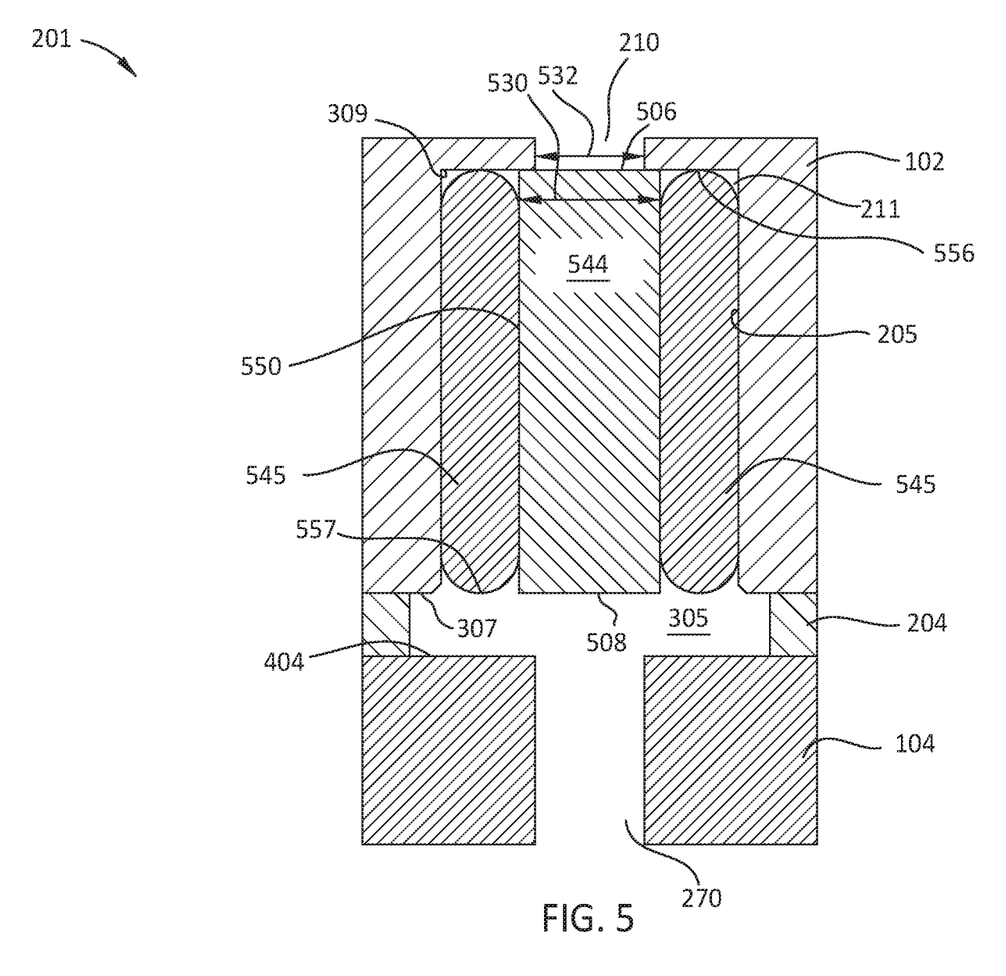

FIG. 5 is a schematic cross-section of the portion 201 of the substrate support pedestal 116, having a different sealing member 545 and porous plug 544. The porous plug 544 is configured similar to that of the porous plug 244 of FIGS. 2 and 3, however, the instead of comprising a t-shape, the porous plug 544 comprises a cylindrical shape. The sealing member 545 is positioned adjacent to the porous plug 544. For example, the sealing member 545 is positioned between the porous plug 544 and the sidewall of the cavity 211. Further, the sealing member may be positioned between the surface 309 of the cavity 211 and the cooling base 104. The porous plug 544 has diameter 530, top surface 506, bottom surface 508 and surface 550. The top surface 506 contacts the surface 309 of the cavity 211. Further, the surface 508 may be recessed within the cavity 211, coplanar with surface 307 of the electrostatic chuck 102, or extend into the gap 305 formed between the surface 307 of the electrostatic chuck and the surface 404 of the cooling base 104. The diameter 530 of the porous plug 544 is greater than the diameter 532 of the opening 210.

The sealing member 545 may be formed similar to that of the sealing member 245. For example, the sealing member 545 may be an O-ring, a cylindrical gasket, or other ring-shaped seal. Further, the sealing member 545 may be formed from a material that is erosion resistive in the presence of the process gases used during substrate processing as are described above with regard to the sealing member 245. The sealing member 545 forms a radial seal between the surface 550 of the porous plug 544 and the sidewall 205 of the cavity 211. For example, the sealing member 545 contacts the surface 550 of the porous plug 544 and the sidewall 205 of the cavity 211, such as the sealing member 445 illustrated in FIG. 4. Additionally, the sealing member 545 may form an axial seal between the surface 309 of the cavity 211 and the surface 404 of the cooling base 104. For example, the sealing member 545 may contact the surface 309 of the cavity 211 and contact the surface 404 of the cooling base 104. The sealing member 545 includes surfaces 556 and 557. One or more of the surfaces 556 and 557 may have a substantially curved shape. The substantially curved shape may be convex or concave. One or more of the surfaces 556 and 557 may have a substantially flat shape. Further, the bonding layer 204 may protrude into the gap 305 such that the bonding layer 204 at least partially contacts the sealing member 545.

Figure 6:
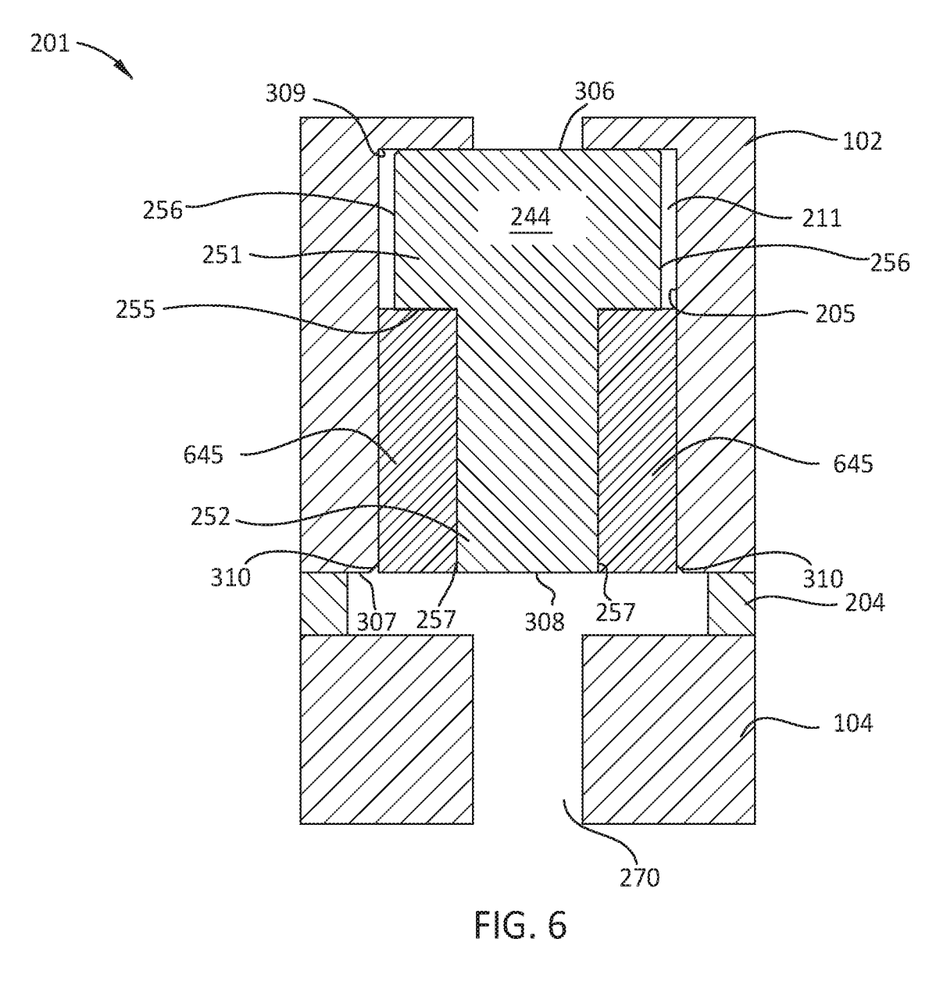

FIG. 6 is a schematic cross-section of the portion 201 of the substrate support pedestal 116 having a different sealing member 645, according to one or more embodiments. As compared to the sealing member 245 of FIG. 3, the sealing member 645 of FIG. 6 is formed from a material applied in a liquid, paste or gel form, that changes state to a substantially solid or gel form. For example, the sealing member 645 may be formed from one of a fluoroelastomer material, a perfluoroelastomer material, and a high purity ceramic potting material, among others, that can be flowed or otherwise disposed in the cavity 211 around the porous plug 244 in a liquid or viscous state, which changes state to a more solid and substantially immobile form. The sealing member 645 is disposed adjacent to the porous plug 244 such that the material is disposed between the surface 257 and the surface 255 of the porous plug 244 and the sidewall 205 of the cavity 211. Further, the material may exposed to a predetermined pressure, temperature, and/or energy source to change the material to a substantially immobile form and generate the sealing member 645. The temperatures used to change the material to a substantially immobile file may be less than about 300 degrees Celsius. Alternatively, other temperatures may be utilized. Additionally, the sealing member 645 secures the porous plug 244 in the cavity 211, forming a radial seal between the surface 257 of the porous plug 244 and the sidewall 205 the cavity 211. Further, the bonding layer 204 may protrude into the gap 305 such that the bonding layer 204 at least partially contacts the sealing member 645.

Figure 7:
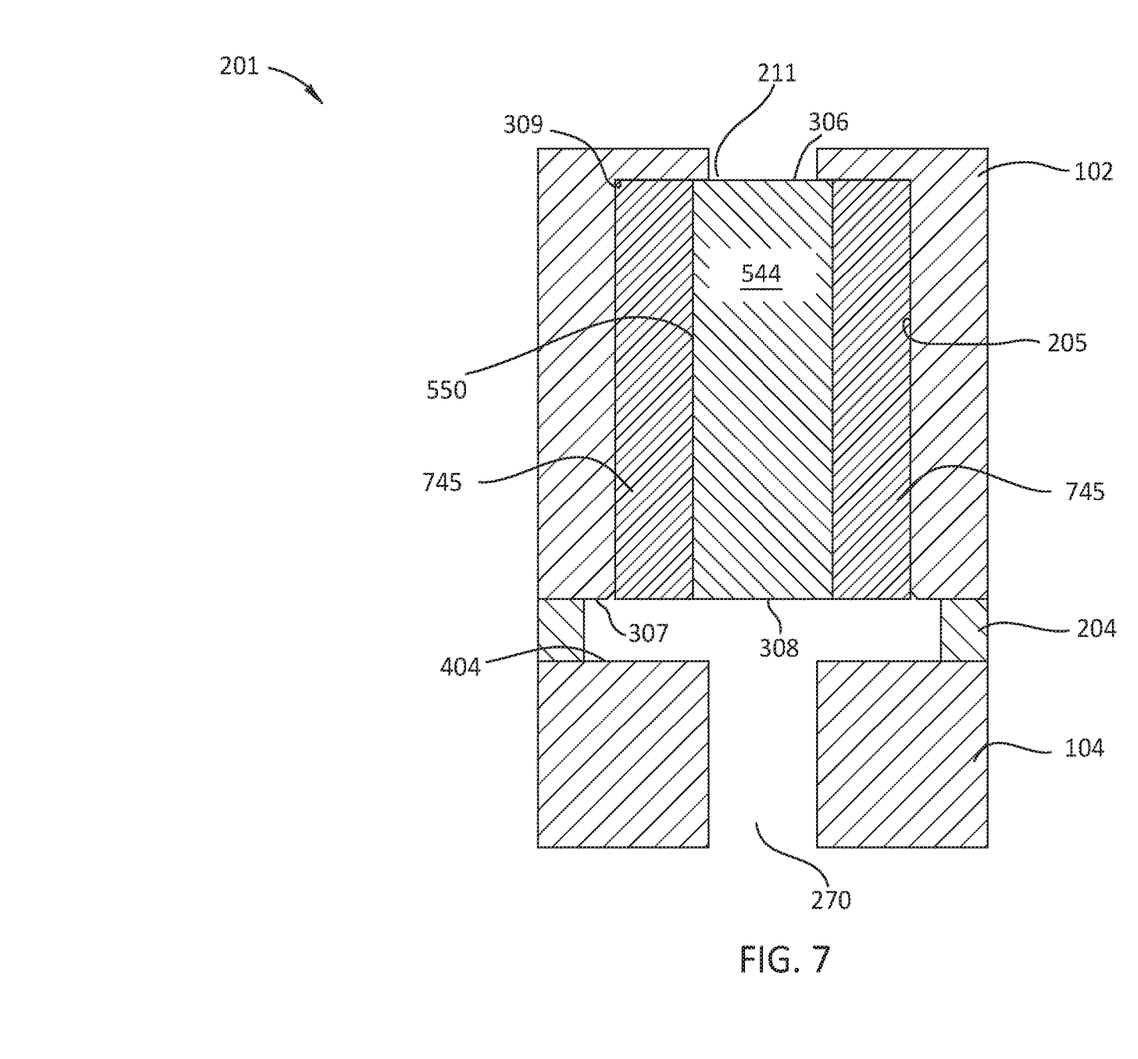

FIG. 7 is a schematic cross-section of the portion 201 of the substrate support pedestal 116 having a different sealing member 745, according to one or more embodiments. As compared to the sealing member 545 of FIG. 5, the sealing member 745 of FIG. 7 is formed from a material applied in a liquid, paste or gel form, that changes state to a substantially solid or gel form. For example, the sealing member 745 may be formed from one of a fluoroelastomer material, a perfluoroelastomer material, and a high purity ceramic potting material, among others, that can be flowed or otherwise disposed in the cavity 211 around the porous plug 544 in a liquid or viscous state, which changes state to a more solid and substantially immobile form. The material may be disposed between the surface 550 of the porous plug 544 and the sidewall 205 and the surface 309 of the cavity 211. Further, the material is exposed to a predetermined pressure, temperature, and/or energy source to change the material to a substantially immobile form and generate the sealing member 745. Additionally, the sealing member 745 contacts the surface 550 of the porous plug 544 and the surface 309 and the sidewall 205 of the cavity 211, securing the porous plug 544 in the cavity 211. Further, the sealing member 745 forms a radial seal between the surface 550 of the porous plug 544 and the sidewall 205 the cavity 211. Further, the bonding layer 204 may protrude into the gap 305 such that the bonding layer 204 at least partially contacts the sealing member 745.

Figure 8:
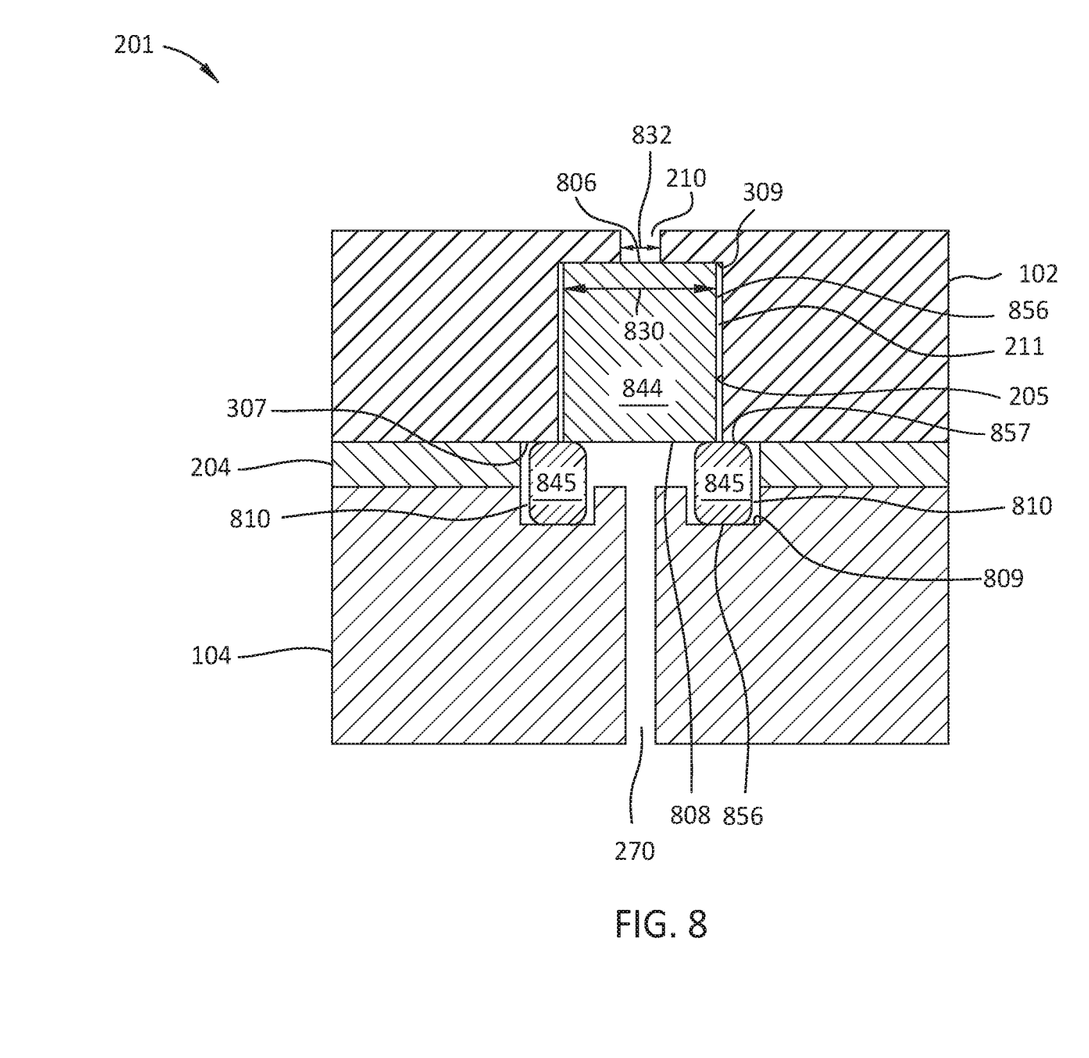

FIG. 8 is a schematic cross-section of the portion 201 of the substrate support pedestal 116, having a different porous plug 844 and a different sealing member 845 as compared to the embodiment of FIG. 2. For example, as compared to the porous plug 244 of FIG. 2, the porous plug 844 comprises a cylindrical shape. Further, as compared to the porous plug 544 of FIG. 5, the diameter 830 of the porous plug 844 is greater than the diameter 530 of the porous plug 544 such that the porous plug 844 fills more of the cavity 211 than porous plug 544. The diameter of the porous plug 844 is greater than the diameter 832 of the opening 210. The top surface 806 contacts the surface 309 of the cavity 211. The surface 808 may be coplanar with surface 307 of the electrostatic chuck 102. The porous plug 844 may have a chamfered edge along the surface 806 similar to that of the porous plug 244 of FIG. 3.

The sealing member 845 may be formed similar to that of the sealing member 245. For example, the sealing member 845 may be an O-ring, a cylindrical gasket, or other ring-shaped seal. Further, the sealing member 845 may be formed from a material that is erosion resistive in the presence of the process gases used during substrate processing as are described above with regard to the sealing member 245. The sealing member 845 forms an axial seal between the surface 808 of the porous plug 844, the surface 307 of the electrostatic chuck 102 and the surface 809 of the cooling base 104. For example, the sealing member 845 contacts the surface 809 of the porous plug 844 and the surface 307 of the electrostatic chuck 102. Further, the sealing member 845 contacts the surface 809 of the cooling base 104.

The sealing member 845 is positioned adjacent to the porous plug 844. For example, the sealing member 845 is positioned between the porous plug 844 and the cooling base 104.

The cooling base 104 may include a groove 810. The surface 809 of the cooling base 104 forms the bottom of the groove 810. The sealing member 845 is positioned in the groove 810 and between the cooling base 104 and the electrostatic chuck 102. The groove 810 at least partially overlaps a portion of the cavity 211 and a portion of the electrostatic chuck 102, thus allowing the groove 810 to effectively position the sealing member 845 across and sealing the gap defined between the porous plug 844 and the electrostatic chuck 102. As compared to embodiments that do not include the groove 810, the groove 810 allows for a larger cross-section seal without increasing the thickness of the bond layer. Further, the groove 810 decreases the effects of manufacturing tolerances and allows for sealing over wider range of temperatures. In one or more embodiments, the cooling base 104 does not include the groove 810 and the sealing member 845 is in contact with the surface 809 in an area overlapping with a portion of the electrostatic chuck 102 and the cavity 211.

The sealing member 845 may secure the porous plug 844 within the cavity 211. For example, the sealing member 845 may exert a force on the surface 808 of the porous plug 844 and the surface 809 of the cooling base 104 such that the porous plug 844 is held within the cavity 211.

The sealing member 845 includes surfaces 856 and 857. One or more of the surfaces 856 and 857 may have a substantially curved shape. The substantially curved shape may be convex or concave. Further, one or more of the surfaces 856 and 857 may have a substantially flat shape. Further, the bonding layer 204 may at least partially contact the sealing member 845.

Figure 9:
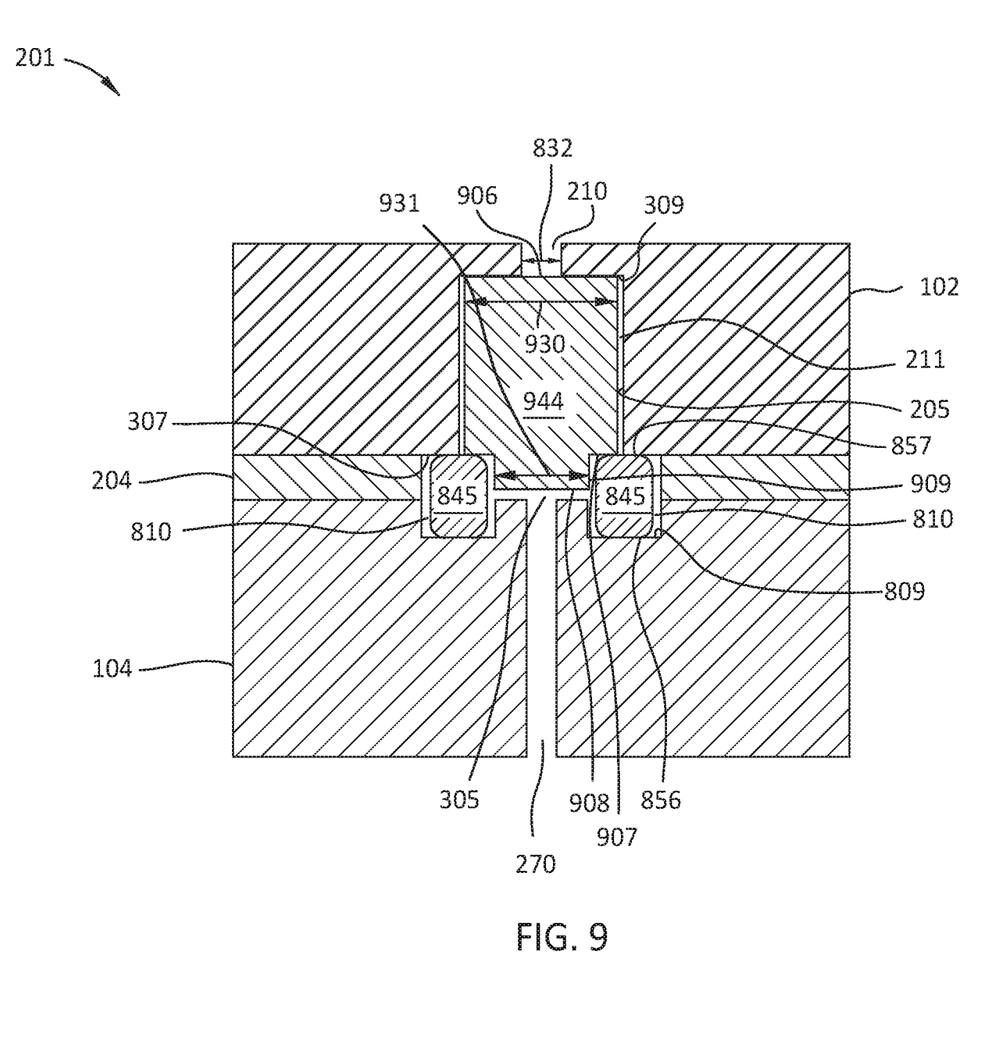

FIG. 9 is a schematic cross-section of the portion 201 of the substrate support pedestal 116, having a porous plug 944 and a sealing member 845, according to one or more embodiments. The sealing member 845 is described in greater detail with regard to FIG. 8. As is described with regard to FIG. 8, the cooling base 104 includes groove 810 at least a portion of the sealing member 845 is positioned with the groove 810.

As compared to the porous plug 844 of the embodiment of FIG. 8, the porous plug 944 includes a surface 908 that extends into the gap 305 between the electrostatic chuck 102 and the cooling base 104. The diameter 931 of the portion of the porous plug 944 that extends into the gap 305 is less than the diameter 930 of the portion of the porous plug 944 that is positioned within the cavity 211. The diameter 930 is greater than the diameter 832 of the opening 210. Alternatively, the diameter 930 is less than or equal to the diameter 832. Further, the top surface 906 of the porous plug 944 contacts the surface 309 of the cavity 211. The porous plug 944 may have a chamfered edge along the surface 906 similar to that of the porous plug 244 of FIG. 3.

The sealing member 845 is positioned adjacent to the porous plug 944. For example, the sealing member 845 is positioned between the porous plug 944 and the cooling base 104. The sealing member 845 contacts the surface 307 of the electrostatic chuck 102, the surface 907 of the porous plug 944, and the surface 809 of the cooling base 104, forming an axial seal between the electrostatic chuck 102 and the cooling base 104. The sealing member 845 may secure the porous plug 944 within the cavity 211. For example, the sealing member 845 may exert a force on the surface 907 of the porous plug 944 and the surface 809 of the cooling base 104 such that the porous plug 944 is held within the cavity 211. Further, the sealing member 845 may contact the surface 909 of the porous plug 944.

The sealing members and porous plugs described herein are suitable for use in substrate support pedestals for protecting the bond layer that bonds the cooling base with the electrostatic chuck from the process gases. Advantageously, protecting the bond layer from the process gases reduces erosion of the bond layer, and maintaining a substantially uniform temperature on a substrate. For example, sealing members that are erosion resistive to the process gases may be utilized to form a radial seal and/or vertical seal between porous plugs of the electrostatic chuck. Such sealing members prevent the flow of process gases into the gap between the electrostatic chuck and the cooling base, and reduce the erosion of the bond layer. Accordingly, a substantially uniform thermal transfer between the cooling base and the electrostatic chuck and a uniform temperature on the substrate is maintained.

While the foregoing is directed to embodiments described herein, other and further embodiments may be devised without departing from the basic scope thereof, and the scope thereof is determined by the claims that follow.

What is claimed is:

1. An electrostatic chuck comprising:
   a body comprising:
     a top surface; and
     a cavity;
   a gas flow passage formed between the top surface and the cavity; and
   a porous plug positioned within the cavity, wherein a sealing member is positioned between the porous plug and a sidewall of the cavity and is configured to form a seal between the porous plug and the cavity.

2. The electrostatic chuck of claim 1, wherein the sealing member is further configured to form a seal between the porous plug and a cooling base bonded to the electrostatic chuck.

3. The electrostatic chuck of claim 2, wherein the sealing member is further positioned between the porous plug and the cooling base.

4. The electrostatic chuck of claim 1, wherein the sealing member secures the porous plug within the cavity.

5. The electrostatic chuck of claim 1, wherein the sealing member is an O-ring or a cylindrical gasket.

6. The electrostatic chuck of claim 1, wherein the sealing member is one of a fluoroelastomer material, perfluoroelastomer material, and a high purity ceramic.

7. The electrostatic chuck of claim 6, wherein the sealing member is formed from material applied in a liquid, paste or gel form.

8. The electrostatic chuck of claim 1, wherein the porous plug has one of a t-shape and a cylindrical shape.

9. A substrate support pedestal comprising:
   an electrostatic chuck having a body comprising a cavity;
   a cooling base coupled to the electrostatic chuck via a bond layer;
   a gas flow passage formed between a top surface of the electrostatic chuck and a bottom surface of the cooling base, the gas flow passage including the cavity;
   a porous plug positioned within the cavity; and
   a sealing member positioned between the porous plug and a sidewall of the cavity, and configured to form a seal between the porous plug and the cavity.

10. The substrate support pedestal of claim 9, wherein the sealing member is further configured to form a seal between the porous plug and the cooling base.

11. The substrate support pedestal of claim 10, wherein the sealing member is positioned between the porous plug and the cooling base.

12. The substrate support pedestal of claim 9, wherein the sealing member secures the porous plug in the cavity.

13. The substrate support pedestal of claim 9, wherein the cooling base includes a groove and the sealing member is positioned within the groove.

14. The substrate support pedestal of claim 9, wherein the sealing member is an O-ring or a cylindrical gasket.

15. The substrate support pedestal of claim 9, wherein the sealing member is one of a fluoroelastomer material, perfluoroelastomer material, and a high purity ceramic.

16. The substrate support pedestal of claim 9, wherein the porous plug has a t-shape or a cylindrical shape.

17. A process chamber comprising:
   a chamber body having a processing volume:
   an electrostatic chuck disposed in the processing volume, the electrostatic chuck having a top surface configured to support a substrate during processing, a bottom surface, and a cavity;
   a cooling base coupled to the electrostatic chuck via a bond layer;
   a gas flow passage formed between the top surface of the electrostatic chuck and a bottom surface of the cooling base, the gas flow passage passing through the cavity;
   a porous plug positioned within the cavity; and
   a sealing member positioned between the porous plug and a sidewall of the cavity, and configured to form a seal between the porous plug and the cavity.

18. The process chamber of claim 17, wherein the sealing member is further configured to form a seal between the porous plug and the cooling base.

19. The process chamber of claim 18, wherein the sealing member is positioned between the porous plug and the cooling base.

20. The process chamber of claim 17, wherein the cooling base includes a groove and the sealing member is positioned within the groove.

* * * * *